US009611560B2

(12) United States Patent
Lu et al.

(10) Patent No.: US 9,611,560 B2
(45) Date of Patent: *Apr. 4, 2017

(54) SULFONAMIDE BASED POLYMERS FOR COPPER ELECTROPLATING

(71) Applicant: Rohm and Haas Electronic Materials LLC, Marlborough, MA (US)

(72) Inventors: Weijing Lu, New Territories (HK); Zuhra I Niazimbetova, Westborough, MA (US); Maria Anna Rzeznik, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/585,227

(22) Filed: Dec. 30, 2014

(65) Prior Publication Data

US 2016/0186345 A1    Jun. 30, 2016

(51) Int. Cl.
*C25D 3/38* (2006.01)
*C25D 5/38* (2006.01)
*C25D 3/58* (2006.01)
*H05K 3/18* (2006.01)

(52) U.S. Cl.
CPC .............. *C25D 3/38* (2013.01); *C25D 3/58* (2013.01); *C25D 5/38* (2013.01); *H05K 3/188* (2013.01)

(58) Field of Classification Search
CPC .............. C25D 3/58; C25D 3/38; C23C 18/40
USPC ................................... 205/239, 80
See application file for complete search history.

(56) References Cited

U.S. PATENT DOCUMENTS

| | | | |
|---|---|---|---|
| 2,643,244 A * | 6/1953 | Simons .................. | C08G 73/00 528/128 |
| 3,347,724 A | 10/1967 | Schneble, Jr. et al. | |
| 3,655,534 A | 4/1972 | Kempe | |
| 3,945,973 A * | 3/1976 | Smith .................. | C07D 303/36 528/210 |
| 4,038,161 A | 7/1977 | Eckles et al. | |
| 4,062,739 A | 12/1977 | James et al. | |
| 4,081,336 A | 3/1978 | Eppensteiner et al. | |
| 4,166,778 A | 9/1979 | Acimovic et al. | |
| 4,169,772 A | 10/1979 | Lowery et al. | |
| 4,206,100 A * | 6/1980 | Kyo ..................... | C08G 63/195 524/183 |
| 4,222,829 A | 9/1980 | Popescu | |
| 4,251,331 A | 2/1981 | Rosenberg | |
| 4,412,047 A * | 10/1983 | Monnier ................ | C08G 59/24 525/507 |
| 4,447,368 A | 5/1984 | Emde et al. | |
| 5,001,175 A * | 3/1991 | Skora .................... | C08G 59/444 523/448 |
| 5,232,575 A | 8/1993 | Dodd | |
| 5,684,195 A | 11/1997 | Huang et al. | |
| 6,380,429 B1 | 4/2002 | Smith | |
| 6,425,996 B1 | 7/2002 | Dahms et al. | |
| 6,436,269 B1 | 8/2002 | Opaskar et al. | |
| 6,645,364 B2 * | 11/2003 | Calvert .................. | C25D 21/12 205/101 |
| 7,128,822 B2 | 10/2006 | Wang et al. | |
| 7,150,781 B2 * | 12/2006 | Urata ....................... | C25D 3/58 106/1.26 |
| 7,374,652 B2 | 5/2008 | Hayashi et al. | |
| 7,446,263 B2 | 11/2008 | En | |
| 7,662,981 B2 | 2/2010 | Wang et al. | |
| 7,781,542 B2 | 8/2010 | Hadley et al. | |
| 8,012,334 B2 | 9/2011 | Reddington et al. | |
| 8,048,284 B2 | 11/2011 | Reddington et al. | |
| 8,262,891 B2 | 9/2012 | Wang et al. | |
| 8,262,895 B2 | 9/2012 | Niazimbetova et al. | |
| 8,268,157 B2 | 9/2012 | Niazimbetova | |
| 8,268,158 B2 | 9/2012 | Niazimbetova et al. | |
| 8,329,018 B2 | 12/2012 | Reddington et al. | |
| 8,337,688 B2 | 12/2012 | Reddington et al. | |
| 8,454,815 B2 | 6/2013 | Niazimbetova et al. | |
| 8,679,316 B2 | 3/2014 | Brunner et al. | |
| 8,747,643 B2 | 6/2014 | Niazimbetova et al. | |
| 2007/0007143 A1 | 1/2007 | Hayashi et al. | |
| 2011/0011746 A1 | 1/2011 | Brunner et al. | |
| 2011/0062029 A1 | 3/2011 | Isono et al. | |
| 2011/0067812 A1 * | 3/2011 | Hadley ................ | C08G 59/686 156/330 |
| 2011/0220514 A1 | 9/2011 | Niazimbetova | |

FOREIGN PATENT DOCUMENTS

| | | |
|---|---|---|
| EP | 0289689 A1 | 9/1988 |
| EP | 1069211 A2 | 1/2001 |
| EP | 1371757 A1 | 12/2003 |
| EP | 1619274 A2 | 1/2006 |
| JP | 10102277 A | 4/1998 |
| WO | 2009002385 A2 | 12/2008 |
| WO | 2009132861 A2 | 5/2009 |
| WO | 2011029781 A1 | 3/2011 |

OTHER PUBLICATIONS

Wang, et al, "Through-hole copper electrolating using nitrotetrazolium blue chloride as a leveler", J of Electrochemical Society, 2013, pp. D85-D88, vol. 160, No. 3.
Dow, et al, "Microvia filling by copper electroplating using diazine black as a leveler", Electrochimica Acta, 2009, pp. 5894-5901, vol. 54.

(Continued)

*Primary Examiner* — Randy Gulakowski
*Assistant Examiner* — Ha S Nguyen
(74) *Attorney, Agent, or Firm* — John J. Piskorski

(57) ABSTRACT

Sulfonamide based polymers are reaction products of sulfonamides and epoxides. The polymers may be used as levelers in copper electroplating baths, to provide good throwing power. Such reaction products may plate copper or copper alloys with good surface properties and good physical reliability.

11 Claims, No Drawings

(56) References Cited

OTHER PUBLICATIONS

Dow, et al, "Copper fill of microvia using a thiol-modified Cu seed layer and various levelers," J of Electrochemical Society, 2009, pp. D314-D320, vol. 156, No. 8.

Gao, et al, "Polyhydroxylalkyleneamines: a class of hydrophilic cationic polymer-based gene transfer agents," J of Controlled Release, 2009, pp. 38-45, vol. 137.

Search report from corresponding Taiwan 104140992 application, dated Jun. 20, 2016.

Search report from corresponding European 15194687.8-1373 application, dated Jun. 16, 2016.

* cited by examiner

SULFONAMIDE BASED POLYMERS FOR COPPER ELECTROPLATING

FIELD OF THE INVENTION

The present invention is directed to sulfonamide based polymers for copper electroplating. More specifically, the present invention is directed to sulfonamide based polymers for copper electroplating where the sulfonamide based polymers are reaction products of sulfonamide or salts thereof, and an epoxide.

BACKGROUND OF THE INVENTION

Methods for electroplating articles with metal coatings generally involve passing a current between two electrodes in a plating solution where one of the electrodes is the article to be plated. A typical acid copper plating solution includes dissolved copper, usually copper sulfate, an acid electrolyte such as sulfuric acid in an amount sufficient to impart conductivity to the bath, a source of halide, and proprietary additives to improve the uniformity of the plating and the quality of the metal deposit. Such additives include levelers, accelerators and suppressors, among others.

Electrolytic copper plating solutions are used in a variety of industrial applications, such as decorative and anticorrosion coatings, as well as in the electronics industry, particularly for the fabrication of printed circuit boards and semiconductors. For circuit board fabrication, typically, copper is electroplated over selected portions of the surface of a printed circuit board, into blind vias and trenches and on the walls of through-holes passing between the surfaces of the circuit board base material. The exposed surfaces of blind vias, trenches and through-holes, i.e. the walls and the floor, are first made conductive, such as by electroless metallization, before copper is electroplated on surfaces of these apertures. Plated through-holes provide a conductive pathway from one board surface to the other. Vias and trenches provide conductive pathways between circuit board inner layers. For semiconductor fabrication, copper is electroplated over a surface of a wafer containing a variety of features such as vias, trenches or combinations thereof. The vias and trenches are metallized to provide conductivity between various layers of the semiconductor device.

It is well known in certain areas of plating, such as in electroplating of printed circuit boards ("PCBs"), that the use of levelers in the electroplating bath can be crucial in achieving a uniform metal deposit on a substrate surface. Electroplating a substrate having irregular topography can pose difficulties. During electroplating a voltage drop typically occurs within apertures in a surface, which can result in an uneven metal deposit between the surface and the apertures. Electroplating irregularities are exacerbated where the voltage drop is relatively extreme, that is, where the apertures are narrow and tall. Consequently, depositing a metal layer of substantially uniform thickness is frequently a challenging step in the manufacture of electronic devices. Leveling agents are often used in copper plating baths to provide substantially uniform, or level, copper layers in electronic devices.

The trend of portability combined with increased functionality of electronic devices has driven the miniaturization of PCBs. Conventional multilayer PCBs with through-hole interconnects are not always a practical solution. Alternative approaches for high density interconnects have been developed, such as sequential build up technologies, which utilize blind vias. One of the objectives in processes that use blind vias is the maximizing of via filling while minimizing thickness variation in the copper deposit between the vias and the substrate surface. This is particularly challenging when the PCB contains both through-holes and blind vias.

Leveling agents are used in copper plating baths to level the deposit across the substrate surface and to improve the throwing power of the electroplating bath. Throwing power is defined as the ratio of the through-hole center copper deposit thickness to its thickness at the surface. Newer PCBs are being manufactured that contain both through-holes and blind vias. Current bath additives, in particular current leveling agents, do not always provide level copper deposits between the substrate surface and filled through-holes and blind vias. Via fill is characterized by the difference in height between the copper in the filled via and the surface.

Another problem encountered in copper plating is the formation of nodules on the copper deposit. Nodules are believed to be crystals of the metal being plated and grow out of the plated surface. Nodules may range in diameter from less than 1 micron to as large as several millimeters. Nodules are undesirable for a variety of electrical, mechanical, and cosmetic reasons. For example, nodules are readily detached and carried by cooling air flows into electronic assemblies, both within and external to electronic article housings, where they may cause short-circuit failure. Therefore, the nodules have to be removed before the plated substrates are assembled into electronic articles. Conventional methods of removing the nodules involve laser inspection of each copper plated substrate followed by manual removal of the nodules by workers using microscopes. Such conventional methods leave room for worker error and are inefficient.

Accordingly, there remains a need in the art for leveling agents for use in copper electroplating baths for the manufacture of PCBs that provide level copper deposits while bolstering the throwing power of the bath and reducing nodules.

SUMMARY OF THE INVENTION

A reaction product includes one or more sulfonamides or salts thereof, and one or more epoxides.

A composition includes one or more sources of copper ions, electrolyte and a reaction product including one or more sulfonamides or salts thereof, and one or more epoxides.

A method includes: providing a substrate; providing a composition including one or more sources of copper ions, electrolyte and a reaction product including one or more sulfonamides or salts thereof, and one or more epoxides; contacting a substrate with the composition; applying a current to the substrate and the composition; and depositing copper or copper alloy on the substrate.

The reaction products provide copper layers having a substantially level surface across a substrate, even on substrates having small features and on substrates having a variety of feature sizes. The plating methods effectively deposit copper on substrates and in blind vias and through-holes such that the copper plating compositions may have good throwing power. In addition, copper deposits may have good physical reliability in response to thermal shock stress tests and reduced nodules.

DETAILED DESCRIPTION OF THE INVENTION

As used throughout this specification the following abbreviations shall have the following meanings unless the context clearly indicates otherwise: A=amperes; A/dm²=amperes per square decimeter; ° C.=degrees Centigrade; g=gram; ppm=parts per million; L=liter, μm=micron=micrometer; mm=millimeters; cm=centimeters; DI=deionized; mL=milliliter; mol=moles; mmol=millimoles; Mw=weight average molecular weight; Mn=number average molecular weight; and PEG=polyethylene glycol moiety. All numerical ranges are inclusive and combinable in any order, except where it is clear that such numerical ranges are constrained to add up to 100%.

As used throughout the specification, "feature" refers to the geometries on a substrate. "Aperture" refers to recessed features including through-holes and blind vias. As used throughout this specification, the term "plating" refers to metal electroplating. "Deposition" and "plating" are used interchangeably throughout this specification. "Leveler" refers to an organic polymer compound or salt thereof that is capable of providing a substantially level or planar metal layer. The terms "leveler" and "leveling agent" are used interchangeably throughout this specification. "Accelerator" refers to an organic additive that increases the plating rate of the electroplating bath and may function as a brightener. "Suppressor" refers to an organic additive that suppresses the plating rate of a metal during electroplating. The terms "printed circuit boards" and "printed wiring boards" are used interchangeably throughout this specification. The term "moiety" means a part of a molecule or polymer that may include either whole functional groups or parts of functional groups as substructures. The terms "moiety" and "group" are used interchangeably throughout the specification. The term "monomer" and "compound" are used interchangeably in the specification. A "polymer" is a molecule which includes two or more mers. "monomer" means a single mer or small molecule or compound of which two or more compose a polymer. The term "amine" in the context of the present application refers to nitrogen containing compounds which exclude the sulfonamide moiety. The "----" dashed line in chemical structures means an optional double bond. The articles "a" and "an" refer to the singular and the plural.

Polymers are reaction products of one or more sulfonamides or salts thereof, and one or more epoxides. Optionally, one or more amines may be included as a third monomer, thus the polymers may include one or more sulfonamides or salts thereof, one or more epoxides and one or more amines. The reaction products may be used in copper electroplating compositions to plate copper deposits on substrates that may include blind vias, through-holes or combinations thereof. The copper electroplating compositions have good throwing power and the copper deposits have good physical reliability in response to thermal shock stress tests and reduced nodules.

Sulfonamides include compounds having a general formula:

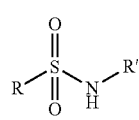
(I)

where R is linear or branched, substituted or unsubstituted alkyl, linear or branched, substituted or unsubstituted alkenyl, linear or branched, substituted or unsubstituted alkynyl, or substituted or insubstituted aryl and R' is hydrogen, linear or branched, substituted or unsubstituted alkyl, linear or branched, substituted or unsubstituted alkenyl, linear or branched substituted or unsubstituted alkynyl or substituted or unsubstituted aryl. Substituent groups include, but are not limited to halogen such as chlorine, bromine, fluorine and iodine, linear or branched halo($C_1$-$C_{10}$)alkyl, hydroxyl, hydroxylalkyl, amine, linear or branched alkylamine, linear or branched alkyl and linear or branched alkoxy.

Preferably, R is substituted or unsubstituted phenyl, substituted or unsubstituted naphthyl, substituted and unsubstituted biphenyl, substituted or unsubstituted ($C_5$-$C_6$)heteroaryl such as thienyl, pyridyl, thiazolyl, oxazolyl, imidazolyl, pyrazolyl, piperidinyl, pyrrolidinyl and morpholinyl, linear or branched, substituted or unsubstituted ($C_1$-$C_{10}$)alkyl, linear or branched, substituted or unsubstituted ($C_2$-$C_{10}$)alkenyl, linear or branched, substituted or unsubstituted ($C_2$-$C_{10}$)alkynyl. Preferably R' is hydrogen, substituted or unsubstituted phenyl, linear or branched, substituted or unsubstituted ($C_1$-$C_{10}$)alkyl, linear or branched, substituted or unsubstituted ($C_2$-$C_{10}$)alkenyl, linear or branched, substituted or unsubstituted ($C_2$-$C_{10}$)alkynyl, or linear or branched, substituted or unsubstituted ($C_1$-$C_{10}$)alkoxy. Substituent groups include, but are not limited to halogen, linear or branched halo($C_1$-$C_{10}$)alkyl, hydroxyl, linear or branched hydroxyl($C_1$-$C_{10}$)alkyl and linear or branched ($C_1$-$C_{10}$)alkylamine.

More preferably R is substituted or unsubstituted phenyl or substituted or unsubstituted naphthyl, substituted or unsubstituted ($C_5$-$C_6$)heteroaryl and R' is hydrogen, linear or branched, substituted or unsubstituted ($C_1$-$C_5$)alkyl, linear or branched, substituted or unsubstituted ($C_1$-$C_{10}$)alkoxy and linear or branched, substituted or unsubstituted ($C_1$-$C_{10}$) alkylamine. Substituent groups include, but are not limited to halogen, hydroxyl, linear or branched hydroxyl($C_1$-$C_5$) alkyl, amine and linear or branched ($C_1$-$C_5$)alkylamine Sulfonamides also include those having a formula:

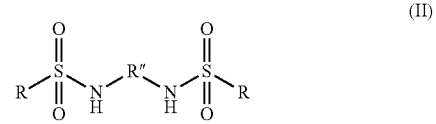
(II)

where R is as defined above and R" is substituted or unsubstituted arylene, linear or branched ($C_1$-$C_{10}$)alkylene or a moiety having the following structure:

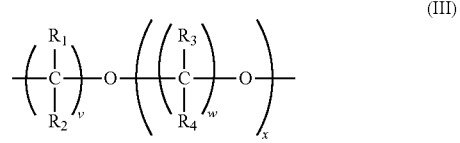
(III)

where $R_1$, $R_2$, $R_3$ and $R_4$ are the same or different and are chosen from hydrogen and linear or branched ($C_1$-$C_5$)alkyl, v, w and x are the same or different and are integers 1-10, preferably 1-5, more preferably 1-3. Substituents on the arylene include, but are not limited to hydroxyl, linear or branched hydroxyl($C_1$-$C_5$)alkyl, —$NO_2$, primary or secondary amine, linear or branched ($C_1$-$C_5$)alkylamine.

Salts of the foregoing sulfonamides include, but are not limited to alkali metal salts such as sodium and potassium salts. When salts are used, preferably, sodium salts are used.

Sulfonamides and salts of sulfonamides may be mixed together to form the reaction products.

Epoxide compounds include those having 1 or more epoxide moieties, preferably 2 or more joined together by a linkage, more preferably 2 to 4 epoxide moieties are present. Preferably, such epoxides include, but are not limited to compounds having formula:

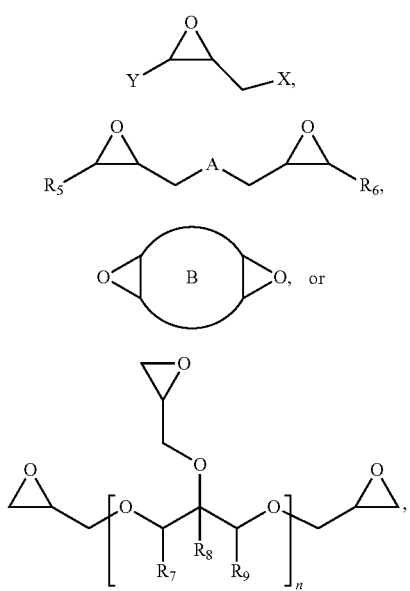

where Y, $R_5$ and $R_6$ may be the same or different and are chosen from hydrogen and $(C_1-C_4)$alkyl, X is halogen, such as chlorine, bromine, fluorine and iodine, A=$OR_{10}$ or $R_{11}$; $R_{10}$=$((CR_{12}R_{13})_mO)$, $(aryl-O)_p$, $CR_{12}R_{13}$—Z—$CR_{12}CR_{13}$, or $OZ'_tO$, $R_{11}$=$(CH_2)_y$, B is $(C_5-C_{12})$cycloalkyl, Z=a 5- or 6-membered ring, Z' is $R_{14}OArOR_{14}$, $(R_{15}O)_bAr(OR_{15})$, or $(R_{15}O)_b$, $Cy(OR_{15})$, Cy=$(C_5-C_{12})$cycloalkyl; each $R_{12}$ and $R_{13}$ are independently chosen from hydrogen, methyl, or hydroxyl, each $R_{14}$ represents $(C_1-C_8)$alkyl, each $R_{15}$ represents a $(C_2-C_6)$alkyleneoxy; $R_7$ is a hydrogen atom, a formyl group, or one or two glycidyl ether groups each optionally containing a carbonyl group constituted by $C_4-C_8$ and $C_2-C_4$, $R_8$ is a hydrogen atom, a methyl group or an ethyl group, and $R_9$ is a hydrogen atom, a formyl group, or one or two glycidyl ether groups each optionally containing a carbonyl group constituted by $C_4-C_8$ and $C_2-C_4$, each b=1-10, m=1-6, n=1-4, p=1-6, t=1-4 and y=0-6. $R_5$ and $R_6$ are preferably independently chosen from hydrogen and $(C_1-C_2)$alkyl. When $R_5$ and $R_6$ are not joined to form a cyclic compound, it is preferred that $R_5$ and $R_6$ are both hydrogen. When $R_5$ and $R_6$ are joined to form a cyclic compound, it is preferred that A is $R_{11}$ or a chemical bond and that a $(C_8-C_{10})$carbocyclic ring is formed. It is preferred that m=2-4. Phenyl-0 is the preferred aryl-O group for $R_{10}$. It is preferred that p=1-4, more preferably 1-3, and still more preferably 1-2. Z is preferably a 5- or 6-membered carbocyclic ring and, more preferably, Z is a 6-membered carbocyclic ring. Preferably, y=0-4, and more preferably, 1-4. When A=$R_{11}$ and y=0, then A is a chemical bond. Preferably, Z'=$R_{14}OArOR_{14}$ or $(R_{15}O)_bAr(OR_{15})$. Each $R_{14}$ is preferably $(C_1-C_6)$alkyl and more preferably $(C_1-C_4)$alkyl. Each $R_{15}$ is preferably $(C_2-C_4)$alkyleneoxy. It is preferred that t=1-2. Preferably, b=1-8, more preferably, 1-6, and most preferably, 1-4. Each Ar group may be substituted with one or more substituent groups which include, but are not limited to, $(C_1-C_4)$alkyl, $(C_1-C_4)$alkoxy or halogen. Preferably Ar is $(C_6-C_{15})$aryl. Exemplary aryl groups are phenyl, methylphenyl, naphthyl, pyridinyl, bisphenylmethyl and 2,2-bisphenylpropyl. Preferably Cy is $(C_6-C_{15})$cycloalkyl. The $(C_5-C_{12})$cycloalkyl groups for B may be monocyclic, spirocyclic, fused or bicyclic groups. Preferably B is a $(C_8-C_{10})$cycloalkyl, more preferably, cyclooctyl. Preferably, $R_7$ and $R_9$ are independently a hydrogen atom or a glycidyl ether group and $R_8$ is a hydrogen atom or an ethyl group.

Compounds of formula (IV) include, but are not limited to epichlorohydrin and epibromohydrin.

Compounds of formula (V) include, but are not limited to, 1,4-butanediol diglycidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether and poly(propyleneglycol) diglycidyl ether.

Compounds of formula (VI) include, but are not limited to, dicyclopentadiene dioxide and 1,2,5,6-diepoxycyclooctane.

Compounds of formula (VII) include, but are not limited to, glycerin triglycidyl ether, trimethylolpropanetriglycidyl ether, diglycerol tetraglycidyl ether, erythritol tetraglycidyl ether, arabinose tetraglycidyl ether, triglycerol pentaglycidyl ether, fructose pentaglycidyl ether, xylitol pentaglycidyl ether, tetraglycerol hexaglycidyl ether, and sorbitol hexaglycidyl ether.

Optionally, but preferably, one or more amines may be included as monomers. Such amines include, but are not limited to primary, secondary and hydroxyl amines. Such amines may have the following structure:

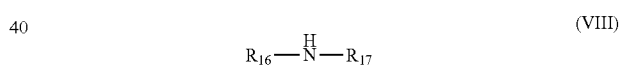

where $R_{16}$ and $R_{17}$ are the same or different and include, but are not limited to hydrogen, linear or branched $(C_1-C_{10})$ alkyl, linear or branched hydroxyl$(C_1-C_{10})$alkyl, or substituted or unsubstituted aryl. Substituent groups on the aryl include, but are not limited to hydroxyl, hydroxyl$(C_1-C_{10})$ alkyl, linear or branched $(C_1-C_{10})$alkyl, amine, $(C_1-C_{10})$ alkylamine and —$NO_2$. Preferably $R_{16}$ and $R_{17}$ are different and are hydrogen, hydroxyl or linear or branched hydroxyl $(C_1-C_{10})$alkyl, more preferably, $R_{16}$ and $R_{17}$ are different and are hydrogen or linear or branched hydroxyl$(C_1-C_5)$alkyl.

Amines also include polyamines. Such polyamines include but are not limited to compounds having general formula:

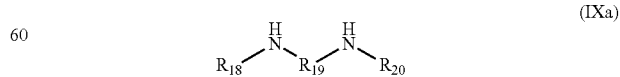

where $R_{19}$ is a —$(CH_2-CH_2)_i$—, —$(CH_2-CH_2)_i$—$(NH-R_{21}-NH)_k$—$(CH_2-CH_2)_i$—, —$(CH_2-CH_2)_i$—$(O-R_{22}-O)_r$—$(CH_2)_i$, a substituted or unsubstituted $(C_6-C_{18})$ aryl, where $R_{21}$ is —$(CH_2-CH_2)_i$—, or

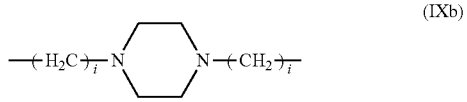

(IXb)

where i, k and r are independently integers of one or greater, preferably from 1 to 10; $R_{18}$ and $R_{20}$ are independently hydrogen, linear or branched $(C_1-C_{12})$alkyl or substituted or unsubstituted $(C_6-C_{18})$aryl, where when $R_{18}$ and $R_{20}$ are $(C_1-C_{12})$alkyl, they may be taken together with all of the atoms in the group to form a ring. $R_{22}$ is linear or branched $(C_2-C_{10})$alkyl. Substituents on the aryl groups include, but are not limited to linear or branched $(C_1-C_{12})$alkyl, linear or branched hydroxy$(C_1-C_{12})$alkyl, or hydroxyl.

Amines also include heterocyclic nitrogen compounds which may be aromatic or non-aromatic. Preferably the amines are heterocyclic nitrogen compounds. Heterocyclic nitrogen compounds include, but are not limited to, imidazoles, triazoles, tetrazoles, pyrazines, benzimidazoles, benzotriazoles, purines, piperazines, pyridazines, pyrazoles, triazines, tetrazines, pyrimidines, benzoxazoles, oxazoles, pyridines, morpholines, pyrrolidines, pyrroles, quinolines, isoquinolines and benzothiazoles. The heterocyclic nitrogen compounds may have one or more substituent groups joined to the rings. Such substituent groups include, but are not limited to linear or branched, substituted or unsubstituted alkyl, hydroxyl, nitro or nitroalkyl, nitroso or nitrosoalkyl, carbonyl, mercapto or mercaptoalkyl, linear or branched hydroxyalkyl, carboxyl, linear or branched carboxyalkyl, linear or branched alkoxy, substituted or unsubstituted aryl, linear or branched, substituted or unsubstituted arylalkyl, linear or branched, substituted or unsubstituted aminealkyl, linear or branched, substituted or unsubstituted amine. Preferably the heterocyclic nitrogen compounds have an a hydrogen on a nitrogen of the ring.

Heterocyclic nitrogen compounds may have the following general structure:

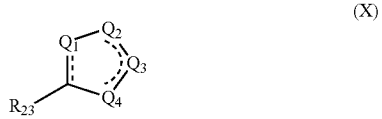

(X)

where $Q_1-Q_4$ may be nitrogen, oxygen, carbon, or sulfur with the proviso that at least one of the $Q_1-Q_4$ is nitrogen, and that only one of the $Q_1-Q_4$ may be oxygen or sulfur at any instance. When sulfur or oxygen is in the ring, sulfur or oxygen is at $Q_4$. Preferably, the ring has one to three nitrogen atoms, more preferably one or two nitrogen atoms. The carbon atoms and nitrogen atoms may be substituted or unsubstituted. Substituents on carbon atoms and nitrogen atoms, including $R_{23}$, include but are not limited to, linear or branched, substituted or unsubstituted $(C_1-C_{10})$alkyl; hydroxyl; linear or branched alkoxy; linear or branched, substituted or unsubstituted hydroxy$(C_1-C_{10})$alkyl; linear or branched, substituted or unsubstituted alkoxy$(C_1-C_{10})$alkyl; linear or branched, substituted or unsubstituted carboxy$(C_1-C_{10})$alkyl; linear or branched, substituted or unsubstituted amine$(C_1-C_{10})$alkyl; substituted or unsubstituted aryl; linear or branched, substituted or unsubstituted aryl$(C_1-C_{10})$alkyl; and substituted or unsubstituted amine. When $Q_1$ is carbon, $R_{23}$ and the substituent on $Q_1$ may be taken together with all of their atoms to form a six-membered carbon or heterocyclic aromatic fused ring with the ring of structure (X).

Heterocyclic nitrogen compounds where $R_{23}$ and the substituent on $Q_1$ when $Q_1$ is carbon are taken together to form a six-membered aromatic fused ring may have the following general structure:

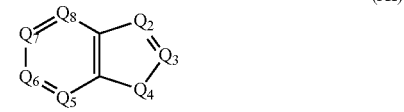

(XI)

where $Q_2-Q_4$ are as defined above and $Q_5-Q_8$ may be carbon or nitrogen atoms with the proviso that only two of $Q_5-Q_8$ may be nitrogen at an instance. The carbon and nitrogen atoms for the rings may be substituted or unsubstituted. Substituents include but are not limited to, hydroxyl; linear or branched alkoxy; linear or branched, substituted or unsubstituted hydroxy$(C_1-C_{10})$alkyl; linear or branched, substituted or unsubstituted alkoxy$(C_1-C_{10})$alkyl; linear or branched, substituted or unsubstituted carboxy$(C_1-C_{10})$ alkyl; linear or branched, substituted or unsubstituted aryl; linear or branched, substituted or unsubstituted aryl$(C_1-C_{10})$ alkyl; and substituted or unsubstituted amine Such compounds include, but are not limited to benzimidazoles, benzotriazoles, benzoxazoles, benzothiazoles, and purines. Preferably, such compounds are benzimidazoles.

Heterocyclic nitrogen compounds also include those having a general structure:

(XII)

where $Q_9-Q_{14}$ may be nitrogen, carbon or oxygen with the proviso that at least one of $Q_9-Q_{14}$ is nitrogen and there are no more than four nitrogen atoms in the ring. The carbon atoms and nitrogen atoms in the ring may be substituted or unsubstituted. Substituent groups may be the same or different and include, but are not limited to, those substituent groups described for $Q_1-Q_8$, above. When oxygen is present in the ring, only one of $Q_9-Q_{14}$ is oxygen at any instance. Heterocyclic nitrogen compounds of structure (XII) may be aromatic or non-aromatic heterocyclic nitrogen compounds.

The order of addition of monomers to a reaction vessel may vary, however, preferably, one or more sulfonamides or salts thereof and one or more amines are dissolved in ethanol at room temperature with dropwise addition of one or more epoxides. The temperature of the heating bath is then increased from room temperature to 110° C. Heating with stirring is done for 2 hours to 4 hours. All of the solvent is removed at 110° C. The reaction mixture is still kept at 110° C. in neat state for additional 0.5 hours to 1.5 hours. The amounts for each component may vary but, in general, sufficient amount of each reactant is added to provide a product where the molar ratio of the moieties of the sulfonamide to the epoxy ranges from 0.5-5:0.5-5, preferably 1-4:1-4. When one or more amines are included, the molar ratio of sulfonamide to epoxy to amine ranges from 0.5-5: 0.1-5:0.01-5 based on monomer molar ratios, preferably from 1-3:1-3:1-3. Preferably the reaction products consist of one or more sulfonamides or salts thereof and one or more epoxides. More preferably the reaction products consist of one or more sulfonamides or salts thereof, one or more amines and one or more epoxides.

The plating compositions and methods which include one or more of the reaction products are useful in providing a substantially level plated copper layer on a substrate, such as a printed circuit board or semiconductor chip. Also, the plating compositions and methods are useful in filling apertures in a substrate with copper. The copper deposits may have good throwing power and good physical reliability in response to thermal shock stress tests. Also, the copper deposits have reduced nodules.

Any substrate upon which copper can be electroplated may be used as a substrate with the metal plating compositions containing the reaction products. Such substrates include, but are not limited to printed wiring boards, integrated circuits, semiconductor packages, lead frames and interconnects. An integrated circuit substrate may be a wafer used in a dual damascene manufacturing process. Such substrates typically contain a number of features, particularly apertures, having a variety of sizes. Through-holes in a PCB may have a variety of diameters, such as from 50 μm to 350 μm in diameter. Such through-holes may vary in depth, such as from 0.8 mm to 10 mm PCBs may contain blind vias having a wide variety of sizes, such as up to 200 μm diameter and 150 μm depth, or greater.

Copper plating compositions contain a source of copper ions, an electrolyte, and a leveling agent, where the leveling agent is a reaction product of one or more sulfonamides or salts thereof, one or more epoxides and optionally one or more amines. The copper plating compositions may contain a source of halide ions, an accelerator or brightener and a suppressor. In addition to copper, the plating compositions may include one or more alloying metals such as tin for plating copper/tin alloys.

Suitable copper ion sources are copper salts and include without limitation: copper sulfate; copper halides such as copper chloride; copper acetate; copper nitrate; copper tetrafluoroborate; copper alkylsulfonates; copper aryl sulfonates; copper sulfamate; copper perchlorate and copper gluconate. Exemplary copper alkane sulfonates include copper $(C_1-C_6)$alkane sulfonate and more preferably copper $(C_1-C_3)$alkane sulfonate. Preferred copper alkane sulfonates are copper methanesulfonate, copper ethanesulfonate and copper propanesulfonate. Exemplary copper arylsulfonates include, without limitation, copper benzenesulfonate and copper p-toluenesulfonate. Mixtures of copper ion sources may be used. One or more salts of metal ions other than copper ions may be added to the present electroplating baths. Typically, the copper salt is present in an amount sufficient to provide an amount of copper metal of 10 to 400 g/L of plating solution.

Suitable tin compounds include, but are not limited to salts, such as tin halides, tin sulfates, tin alkane sulfonate such as tin methane sulfonate, tin aryl sulfonate such as tin benzenesulfonate and tin p-toluenesulfonate. The amount of tin compound in these electrolyte compositions is typically an amount that provides a tin content in the range of 5 to 150 g/L. Mixtures of tin compounds may be used in an amount as described above.

The electrolyte useful in the present invention may be alkaline or acidic. Preferably the electrolyte is acidic. Preferably, the pH of the electrolyte is <2. Suitable acidic electrolytes include, but are not limited to, sulfuric acid, acetic acid, fluoroboric acid, alkanesulfonic acids such as methanesulfonic acid, ethanesulfonic acid, propanesulfonic acid and trifluoromethane sulfonic acid, aryl sulfonic acids such as benzenesulfonic acid, p-toluenesulfonic acid, sulfamic acid, hydrochloric acid, hydrobromic acid, perchloric acid, nitric acid, chromic acid and phosphoric acid. Mixtures of acids may be used in the present metal plating baths. Preferred acids include sulfuric acid, methanesulfonic acid, ethanesulfonic acid, propanesulfonic acid, hydrochloric acid and mixtures thereof. The acids may be present in an amount in the range of 1 to 400 g/L. Electrolytes are generally commercially available from a variety of sources and may be used without further purification.

Such electrolytes may optionally contain a source of halide ions. Typically chloride ions are used. Exemplary chloride ion sources include copper chloride, tin chloride, sodium chloride, potassium chloride and hydrochloric acid. A wide range of halide ion concentrations may be used in the present invention. Typically, the halide ion concentration is in the range of 0 to 100 ppm based on the plating bath. Such halide ion sources are generally commercially available and may be used without further purification.

The plating compositions typically contain an accelerator. Any accelerators (also referred to as brightening agents) are suitable for use in the present invention. Such accelerators are well-known to those skilled in the art. Accelerators include, but are not limited to, N,N-dimethyl-dithiocarbamic acid-(3-sulfopropyl)ester; 3-mercapto-propylsulfonic acid-(3-sulfopropyl)ester; 3-mercapto-propylsulfonic acid sodium salt; carbonic acid, dithio-O-ethylester-S-ester with 3-mercapto-1-propane sulfonic acid potassium salt; bis-sulfopropyl disulfide; bis-(sodium sulfopropyl)-disulfide; 3-(benzothiazolyl-S-thio)propyl sulfonic acid sodium salt; pyridinium propyl sulfobetaine; 1-sodium-3-mercaptopropane-1-sulfonate; N,N-dimethyl-dithiocarbamic acid-(3-sulfoethyl)ester; 3-mercapto-ethyl propylsulfonic acid-(3-sulfoethyl)ester; 3-mercapto-ethylsulfonic acid sodium salt; carbonic acid-dithio-O-ethylester-S-ester with 3-mercapto-1-ethane sulfonic acid potassium salt; bis-sulfoethyl disulfide; 3-(benzothiazolyl-S-thio)ethyl sulfonic acid sodium salt; pyridinium ethyl sulfobetaine; and 1-sodium-3-mercaptoethane-1-sulfonate. Accelerators may be used in a variety of amounts. In general, accelerators are used in an amount in a range of 0.1 ppm to 1000 ppm.

Any compound capable of suppressing the metal plating rate may be used as a suppressor in the present electroplating compositions. Suitable suppressors include, but are not limited to, polypropylene glycol copolymers and polyethylene glycol copolymers, including ethylene oxide-propylene oxide ("EO/PO") copolymers and butyl alcohol-ethylene oxide-propylene oxide copolymers. Suitable butyl alcohol-ethylene oxide-propylene oxide copolymers are those having a weight average molecular weight of 100 to 100,000, preferably 500 to 10,000. When such suppressors are used, they are typically present in an amount in the range of 1 to 10,000 ppm based on the weight of the composition, and more typically from 5 to 10,000 ppm. The leveling agents of the present invention may also possess functionality capable of acting as suppressors.

In general, the reaction products have a number average molecular weight (Mn) of 200 to 100,000, typically from 300 to 50,000, preferably from 500 to 30,000, although reaction products having other Mn values may be used. Such reaction products may have a weight average molecular weight (Mw) value in the range of 1000 to 50,000, typically from 5000 to 30,000, although other Mw values may be used.

The amount of the reaction product or leveling agent used in the metal electroplating compositions depends upon the particular leveling agents selected, the concentration of the copper and any alloying metal ions in the electroplating composition, the particular electrolyte used, the concentration of the electrolyte and the current density applied. In general, the total amount of the leveling agent in the electroplating composition ranges from 0.01 ppm to 500 ppm, preferably from 0.1 ppm to 250 ppm, most preferably from 0.5 ppm to 100 ppm, based on the total weight of the plating composition, although greater or lesser amounts may be used.

The electroplating compositions may be prepared by combining the components in any order. It is preferred that the inorganic components such as source of metal ions, water, electrolyte and optional halide ion source are first added to the bath vessel, followed by the organic components such as leveling agent, accelerator, suppressor, and any other organic component.

The electroplating compositions may optionally contain at least one additional leveling agent. Such additional leveling agents may be another leveling agent of the present invention, or alternatively, may be any conventional leveling agent. Suitable conventional leveling agents that can be used in combination with the present leveling agents include, without limitations, those disclosed in U.S. Pat. No. 6,610,192 to Step et al., U.S. Pat. No. 7,128,822 to Wang et al., U.S. Pat. No. 7,374,652 to Hayashi et al. and 6,800,188 to Hagiwara et al. Such combination of leveling agents may be used to tailor the characteristics of the plating bath, including leveling ability and throwing power.

Typically, the plating compositions may be used at any temperature from 10 to 65° C. or higher. Preferably, the temperature of the plating composition is from 10 to 35° C. and more preferably from 15 to 30° C.

In general, the metal electroplating compositions are agitated during use. Any suitable agitation method may be used and such methods are well-known in the art. Suitable agitation methods include, but are not limited to: air sparging, work piece agitation, and impingement.

Typically, a substrate is electroplated by contacting the substrate with the plating composition. The substrate typically functions as the cathode. The plating composition contains an anode, which may be soluble or insoluble. Potential is typically applied to the electrodes. Sufficient current density is applied and plating performed for a period of time sufficient to deposit a metal layer having a desired thickness on the substrate as well as to fill blind vias, trenches and through-holes, or to conformally plate through-holes. Current densities may range from 0.05 to 10 A/dm$^2$, although higher and lower current densities may be used.

The specific current density depends in part upon the substrate to be plated, the composition of the plating bath, and the desired surface metal thickness. Such current density choice is within the abilities of those skilled in the art.

Substantially level metal deposits are obtained on a PCB. Through-holes, blind vias or combinations thereof in the PCB are substantially filled or through-holes are conformally plated with desirable throwing power. A further advantage of the present invention is that a wide range of apertures and aperture sizes may be filled or conformally plated with desirable throwing power.

Throwing power is defined as the ratio of the average thickness of the metal plated in the center of a through-hole compared to the average thickness of the metal plated at the surface of the PCB sample and is reported as a percentage. The higher the throwing power, the better the plating composition is able to conformally plate the through-hole. Metal plating compositions of the present invention may have a throwing power of >65%, preferably >70%.

The reaction products provide copper layers having a substantially level surface across a substrate, even on substrates having small features and on substrates having a variety of feature sizes. The plating methods effectively deposit copper and copper alloys on substrates and in blind vias and through-holes such that the copper plating compositions may have good throwing power. In addition, copper deposits may have good physical reliability in response to thermal shock stress tests and reduced nodules.

The following examples are intended to further illustrate the invention but are not intended to limit its scope.

EXAMPLE 1

To a 100 mL round bottom three-neck flask equipped with a condenser and a magnetic stirrer, 5 mmol benzenesulfonamide was added followed by addition of a solution of 5 mmol poly(ethyleneglycol) diglycidyl ether (Mn 526) in 30 mL of ethanol. 5 mg K$_2$CO$_3$ was then added into the reaction mixture. The mixture was heated in an oil bath at 110° C. for 4 hours. All the solvent was then removed within one hour. The reaction mixture was stirred at 110° C. in neat state for an additional 1 hour. A beige solid material was obtained at room temperature, reaction product 1. The product was transferred into a 100 mL volumetric flask, rinsed and diluted with 30% sulfuric acid to form a light beige colored solution.

Two additional reaction products were prepared substantially according to the method described above except that the sulfonamide monomers were varied as disclosed in Table 1.

TABLE 1

| Reaction Product | Monomer 1 (M$_1$) | Monomer 2 (M$_2$) | Molar Ratio (M$_1$:M$_2$) |
|---|---|---|---|
| 1 | benzenesulfonamide (C$_6$H$_5$-SO$_2$-NH$_2$) | polyethyleneglycoldiglycidyl ether | 1:1 |

TABLE 1-continued

| Reaction Product | Monomer 1 ($M_1$) | Monomer 2 ($M_2$) | Molar Ratio ($M_1:M_2$) |
|---|---|---|---|
| 2 | 4-(2-aminoethyl)benzenesulfonamide ($H_2N-CH_2CH_2-C_6H_4-SO_2NH_2$) | polyethyleneglycoldiglycidyl ether | 1:1 |
| 3 | Tol-SO$_2$-NH-CH$_2$-O-CH$_2$-O-CH$_2$-NH-SO$_2$-Tol | polyethyleneglycoldiglycidyl ether | 1:1 |

EXAMPLE 2

To a 100 mL round bottom three-neck flask equipped with a condenser and a magnetic stirrer, 2.5 mmol benzenesulonamide and 2.5 mmol 1 H-imidazole was added followed by addition of a solution of 5 mmol poly(ethyleneglycol) diglycidyl ether (Mn 526) in 40 mL of ethanol. 5 mg $K_2CO_3$ was then added into the reaction mixture. The mixture was heated in an oil bath at 110° C. for 4 hours. All of the solvent was removed at 110° C. within one hour. The reaction mixture was kept at 110° C. in neat state for one additional hour. A slight orange sticky material was obtained as the final product, reaction product 4. The product was transferred into a 100 mL volumetric flask, rinsed and diluted with 10% sulfuric acid to form a light beige colored solution.

Six additional reaction products were prepared substantially according to the method described above except that the monomers were varied as disclosed in Table 2.

TABLE 2

| Reaction Product | Monomer 1 ($M_1$) | Monomer 2 ($M_2$) | Monomer 3 ($M_3$) | Molar Ratio ($M_1:M_2:M_3$) |
|---|---|---|---|---|
| 4 | benzenesulfonamide ($C_6H_5-SO_2NH_2$) | 1 H-imidazole | polyethyleneglycoldiglycidyl | 1:1:2 |
| 5 | Tol-SO$_2$-NH-CH$_2$-O-CH$_2$-O-CH$_2$-NH-SO$_2$-Tol | 1 H-imidazole | polyethyleneglycoldiglycidyl ether | 1:1:2 |
| 6 | benzenesulfonamide ($C_6H_5-SO_2NH_2$) | 1 H-imidazole | 1,4-bis(oxiran-2-ylmethoxy)butane | 1:1:2 |
| 7 | benzenesulfonamide ($C_6H_5-SO_2NH_2$) | 2,5-dimethyl-1H-imidazole | polyethyleneglycoldiglycidyl ether | 1:1:2 |

TABLE 2-continued

| Reaction Product | Monomer 1 (M₁) | Monomer 2 (M₂) | Monomer 3 (M₃) | Molar Ratio (M₁:M₂:M₃) |
|---|---|---|---|---|
| 8 | benzenesulfonamide (C₆H₅SO₂NH₂) | 2-ethyl-1H-imidazole | polyethyleneglycoldiglycidyl ether | 1:1:2 |
| 9 | benzenesulfonamide (C₆H₅SO₂NH₂) | 2-aminoethanol | polyethyleneglycoldiglycidyl ether | 1:1:2 |
| 10 | benzenesulfonamide (C₆H₅SO₂NH₂) | 1-aminopropan-2-ol | polyethyleneglycoldiglycidyl ether | 1:1:2 |

EXAMPLE 3

A plurality of copper electroplating baths were prepared by combining 75 g/L copper as copper sulfate pentahydrate, 240 g/L sulfuric acid, 60 ppm chloride ion, 1 ppm of an accelerator and 1.5 g/L of a suppressor. The accelerator was bis(sodium-sulfopropyl)disulfide. The suppressor was an EO/PO copolymer having a weight average molecular weight of <5,000 and terminal hydroxyl groups. Each electroplating bath also contained one of the reaction products from Examples 1 and 2 in amounts of 0.5 ppm to 500 ppm as shown in Table 3, in Example 4 below. The reaction products were used without purification.

EXAMPLE 4

Samples of a 3.2 mm thick of double-sided FR4 PCBs, 5 cm×9.5 cm, having a plurality of through-holes were electroplated with copper in Haring cells using the copper electroplating baths of Example 3. The 3.2 mm thick samples had 0.3 mm diameter through-holes. The temperature of each bath was 25° C. A current density of 2.15 A/dm² was applied to the 3.2 mm samples for 80 minutes. The copper plated samples were analyzed to determine the throwing power ("TP") of the plating bath, and percent cracking according to the methods described below. Average number of nodules for each sample was also determined by counting them using fingertips across the sample surface and recording the nodules in a given area of the plated surface.

Throwing power was calculated by determining the ratio of the average thickness of the copper plated in the center of a through-hole compared to the average thickness of the copper plated at the surface of the PCB sample. The throwing power is reported in Table 3 as a percentage.

The percent cracking was determined according to the industry standard procedure, IPC-TM-650-2.6.8. Thermal Stress, Plated-Through Holes, published by IPC (Northbrook, Ill., USA), dated May, 2004, revision E.

The results showed that all of the samples tested had reduced nodule formation and some cracking was in the desired range of <10%. Although quality of % cracking varied for the levelers tested, all of the samples had % TP greater than 65% at optimized concentrations and the majority of samples had % TP greater than 70%. Further, the number of nodules counted on the samples was very low and at commercially acceptable levels.

TABLE 3

| Reaction product | Leveler (ppm) | % TP | Nodules | % Cracking |
|---|---|---|---|---|
| 1 | 1 | 50 | 0 | 0 |
|   | 5 | 71 | 0 | 43 |
|   | 10 | 91 | 0 | 61 |
| 2 | 1 | 77 | 0 | 73 |
|   | 5 | 80 | 0 | 20 |
|   | 10 | 69 | 4 | 15 |
| 3 | 1 | 51 | 0 | 48 |
|   | 2 | 58 | 0 | 98 |
|   | 5 | 65 | 0 | 100 |
| 4 | 10 | 68 | 0 | 0 |
|   | 20 | 73 | 0 | 0 |
|   | 50 | 77 | 0 | 0 |
| 5 | 1 | 59 | 0 | 0 |
|   | 2 | 71 | 1 | 58 |
|   | 5 | 94 | 0 | 88 |
| 6 | 0.5 | 65 | 0 | 80 |
|   | 1 | 74 | 0 | 83 |
|   | 2 | 79 | 0 | 83 |
| 7 | 1 | 64 | 0 | 25 |
|   | 5 | 74 | 0 | 33 |
|   | 10 | 69 | 2 | 0 |
| 8 | 5 | 71 | 0 | 0 |
|   | 10 | 72 | 0 | 0 |
|   | 20 | 63 | 0 | 0 |
| 9 | 10 | 64 | 0 | 5 |
|   | 50 | 70 | 0 | 0 |
|   | 100 | 72 | 0 | 2.5 |
| 10 | 100 | 61 | 0 | 0 |
|   | 200 | 64 | 0 | 0 |
|   | 500 | 69 | 0 | 0 |

What is claimed is:

1. An electroplating composition comprising one or more sources of copper ions, water, one or more suppressors, one or more brightening agents, an electrolyte comprising one or more acids selected from the group consisting of sulfuric acid, methanesulfonic acid, ethanesulfonic acid, propanesulfonic acid and hydrochloric acid and one or more sources of halide ions, and a reaction product of one or more sulfonamides or salts thereof, and one or more epoxides.

2. The composition of claim 1, wherein the one or more epoxides comprise

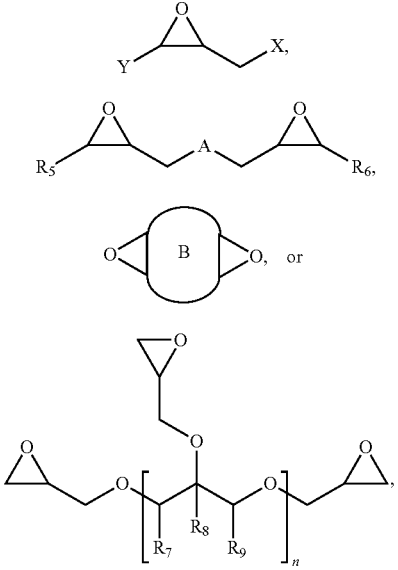

wherein Y, $R_5$ and $R_6$ may be the same or different and are chosen from hydrogen and $C_1$-$C_4$)alkyl, X is halogen, A=$OR_{10}$ or $R_{11}$; $R_{10}$=(($CR_{12}R_{13})_mO$), (aryl-O)$_p$, $CR_{12}R_{13}$—Z—$CR_{12}CR_{13}$, or $OZ'_tO$, $R_{11}$=($CH_2)_y$, B is ($C_5$-$C_{12}$)cycloalkyl, Z=a 5- or 6-membered ring, Z' is $R_{14}OArOR_{14}$,($R_{15}O)_b$Ar($OR_{15}$), or ($R_{15}O)_b$, Cy($OR_{15}$), Cy=($C_5$-$C_{12}$)cycloalkyl; $R_{12}$ and $R_{13}$ are independently chosen from hydrogen, methyl, or hydroxyl, $R_{14}$ represents ($C_1$-$C_8$)alkyl, $R_{15}$ represents a ($C_2$-$C_6$)alkyleneoxy; $R_7$ is a hydrogen atom, a formyl group, or one or two glycidyl ether groups optionally containing a carbonyl group constituted by $C_4$-$C_8$ and $C_2$-$C_4$, $R_8$ is a hydrogen atom, a methyl group or an ethyl group, and $R_9$ is a hydrogen atom, a formyl group, or one or two glycidyl ether groups optionally containing a carbonyl group constituted by $C_4$-$C_8$ and $C_2$-$C_4$, and b=1-10, m=1-6, n=1-4, p=1-6, t=1-4 and y=0-6.

3. The composition of claim 1, wherein the one or more epoxides are chosen from 1,4-butanediol diglycidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether, poly(ethyleneglycol) diglycidyl ether and poly(propyleneglycol) diglycidyl ether.

4. The composition of claim 1, wherein the one or more epoxides are chosen from glycerin triglycidyl ether, trimethylolpropanetriglycidyl ether, diglycerol tetraglycidyl ether, erythritol tetraglycidyl ether, arabinose tetraglycidyl ether, triglycerol pentaglycidyl ether, fructose pentaglycidyl ether, xylitol pentaglycidyl ether, tetraglycerol hexaglycidyl ether, and sorbitol hexaglycidyl ether.

5. The composition of claim 1, wherein the one or more epoxides are chosen from epichlorohydrin and epibromohydrin.

6. The composition of claim 1, wherein the one or more epoxides are chosen from dicyclopentadiene dioxide and 1,2,5,6-diepoxycyclooctane.

7. An electroplating composition comprising one or more sources of copper ions, water, one or more suppressors, one or more brightening agents, an electrolyte comprising one or more acids selected from the group consisting of sulfuric acid, methanesulfonic acid, ethanesulfonic acid, propanesulfonic acid and hydrochloric acid and one or more sources of halide ions, and a reaction product of one or more sulfonamides or salts thereof, one or more epoxides and one or more amines.

8. The composition of claim 7, wherein the one or more amines are chosen from primary amines, secondary amines, hydroxyl amines, polyamines and heterocyclic amines.

9. The composition of claim 8, wherein the heterocyclic amines are chosen from imidazoles, triazoles, tetrazoles, pyrazines, benzimidazoles, benzothiazoles, purines, piperazines, pyridazines, pyrazoles, triazines, tetrazines, pyrimidines, benzoxazoles, oxazoles, pyridines, morpholines, pyrrolidines, pyrroles, quinolines, isoquinolines and benzothiazoles.

10. The composition of claim 7, wherein the one or more epoxides are chosen from 1,4-butanediol diglycidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether, poly(ethyleneglycol) diglycidyl ether and poly(propyleneglycol) diglycidyl ether.

11. The composition of claim 7, wherein the one or more epoxides are chosen from 1,4-butanediol diglycidyl ether, ethylene glycol diglycidyl ether, diethylene glycol diglycidyl ether, triethylene glycol diglycidyl ether, glycerol diglycidyl ether, neopentyl glycol diglycidyl ether, propylene glycol diglycidyl ether, dipropylene glycol diglycidyl ether, poly(ethyleneglycol) diglycidyl ether and poly(propyleneglycol) diglycidyl ether.

* * * * *